US010178776B2

(12) United States Patent
Guo et al.

(10) Patent No.: US 10,178,776 B2
(45) Date of Patent: Jan. 8, 2019

(54) DIFFERENTIAL SIGNAL LINE WIRING METHOD AND PCB BOARD

(71) Applicant: ZTE CORPORATION, Shenzhen, Guangdong (CN)

(72) Inventors: Tao Guo, Guangdong (CN); Fengchao Ma, Guangdong (CN); Yuanwang Zhang, Guangdong (CN)

(73) Assignee: ZTE CORPORATION, Shenzhen, Guangdong (CN)

( * ) Notice: Subject to any disclaimer, the term of this patent is extended or adjusted under 35 U.S.C. 154(b) by 0 days.

(21) Appl. No.: 15/529,183

(22) PCT Filed: May 13, 2015

(86) PCT No.: PCT/CN2015/078903
§ 371 (c)(1),
(2) Date: May 24, 2017

(87) PCT Pub. No.: WO2016/082480
PCT Pub. Date: Jun. 2, 2016

(65) Prior Publication Data
US 2017/0325334 A1 Nov. 9, 2017

(30) Foreign Application Priority Data
Nov. 28, 2014 (CN) .......................... 2014 1 0708381

(51) Int. Cl.
*H05K 1/02* (2006.01)
*H05K 3/10* (2006.01)
*H05K 1/03* (2006.01)

(52) U.S. Cl.
CPC ............. *H05K 3/10* (2013.01); *H05K 1/0245* (2013.01); *H05K 1/0306* (2013.01);
(Continued)

(58) Field of Classification Search
CPC .. H05K 1/00; H05K 1/02; H05K 1/03; H05K 1/0242; H05K 1/0245; H05K 1/0248; H05K 1/0366; H05K 3/00; H05K 3/08
(Continued)

(56) References Cited
U.S. PATENT DOCUMENTS 8,648,260 B2 * 2/2014 Ooi ...................... H05K 1/0248
174/251
8,756,553 B2 * 6/2014 Suwada .............. G06F 17/5077
716/120
(Continued)

FOREIGN PATENT DOCUMENTS

| CN | 102209439 A | 10/2011 |
| CN | 103813614 A | 5/2014 |

(Continued)

OTHER PUBLICATIONS

European Extended Supplementary Search Report dated Nov. 16, 2017 received in European Patent Application No. 15 86 3273.7.
(Continued)

*Primary Examiner* — Xiaoliang Chen
(74) *Attorney, Agent, or Firm* — Scully Scott Murphy & Presser

(57) ABSTRACT

A method for wiring differential signal lines and a PCB are disclosed. The wiring method includes: providing a rectangle-shaped glass fiber fabric formed of glass fibers which are woven and interlaced with each other and an adhesive filled therebetween; determining a wiring direction and obtaining a glass fiber bundle number of the glass fiber fabric in the wiring direction; equally dividing the glass fiber fabric into glass fiber units, and obtaining a width of each glass fiber unit according to a size of the glass fiber fabric in a direction perpendicular to the wiring direction and the number of the glass fiber units; determining a line distance and line widths of the differential signal lines; and according
(Continued)

to the line distance and the line widths, forming the differential signal lines on a metal layer along the wiring direction to make the differential signal lines meet predetermined requirements.

4 Claims, 7 Drawing Sheets

(52) U.S. Cl.
CPC ......... *H05K 1/0248* (2013.01); *H05K 1/0366* (2013.01); *H05K 2201/029* (2013.01)

(58) Field of Classification Search
USPC .......... 174/268, 251, 255, 258; 29/825, 829, 29/846, 593; 428/209; 361/760; 156/64, 156/378
See application file for complete search history.

(56) References Cited

U.S. PATENT DOCUMENTS

| | | | | |
|---|---|---|---|---|
| 9,049,794 | B2* | 6/2015 | Morita | D03D 15/0011 |
| 9,312,593 | B2* | 4/2016 | Hurwitz | H01P 3/081 |
| 2004/0181764 | A1* | 9/2004 | Brist | G06F 17/5077 |
| | | | | 174/258 |
| 2006/0120059 | A1 | 6/2006 | Farkas et al. | |
| 2007/0223205 | A1* | 9/2007 | Liang | H05K 1/0245 |
| | | | | 361/760 |
| 2008/0308306 | A1* | 12/2008 | Liang | H05K 1/0245 |
| | | | | 174/255 |
| 2009/0169842 | A1* | 7/2009 | Morita | H05K 1/0248 |
| | | | | 428/209 |
| 2009/0173525 | A1* | 7/2009 | Morita | H05K 1/0366 |
| | | | | 174/258 |
| 2010/0202118 | A1* | 8/2010 | Liang | H05K 1/0245 |
| | | | | 361/748 |
| 2011/0078895 | A1* | 4/2011 | Suwada | H05K 1/0248 |
| | | | | 29/593 |
| 2011/0232949 | A1* | 9/2011 | Yamada | H05K 1/0245 |
| | | | | 174/255 |
| 2011/0272186 | A1 | 11/2011 | Freda et al. | |
| 2011/0308840 | A1* | 12/2011 | Ooi | H05K 1/0248 |
| | | | | 174/251 |
| 2011/0308842 | A1* | 12/2011 | Morita | D03D 15/0011 |
| | | | | 174/255 |
| 2013/0254733 | A1* | 9/2013 | Suwada | G06F 17/5077 |
| | | | | 716/129 |
| 2014/0350901 | A1* | 11/2014 | Nagaoka | G06F 1/10 |
| | | | | 703/2 |
| 2016/0120018 | A1* | 4/2016 | Chang | H05K 1/0242 |
| | | | | 333/1 |

FOREIGN PATENT DOCUMENTS

| | | |
|---|---|---|
| EP | 2 373 130 A1 | 10/2011 |
| JP | 2007-150000 | 6/2007 |
| JP | 2011-210839 | 10/2011 |

OTHER PUBLICATIONS

International Search Report dated Aug. 26, 2015 issued in International Application No. PCT/CN2015/078903.

* cited by examiner

DIFFERENTIAL SIGNAL LINE WIRING METHOD AND PCB BOARD

CROSS-REFERENCE TO RELATED APPLICATIONS

This application is based upon and claims priority to Chinese Patent Application No. 201410708381.9, filed Nov. 28, 2014, the entire contents of which are incorporated herein by reference.

TECHNICAL FIELD

The present disclosure relates to the field of layout design, and more particularly, to a method for wiring differential signal lines and a PCB (Printed Circuit Board).

BACKGROUND

With the rising of communication service volume and miniaturization of communications devices, the mainstream Serdes signal rate has been raised to 10.3125 Gbps, 12.5 Gbps, or even directly up to 25 Gbps in the next step; as the signal rate is greatly improved, stricter requirements are placed the quality of differential signals, especially the control of pin skew.

In addition to the differences between physical sizes of PCB wires, the glass fiber weave effect of glass fiber fabrics is a more important reason which causes differential signal skew. Because glass fiber fabrics are formed by bonding and laminating glass fiber with epoxy resin, and the relative dielectric constants at various positions are different due to glass fiber warps and wefts, different heights of glass fiber at weaving spacing and varying contents of epoxy resin. After a PCB routes wires (or wires are formed on the PCB), two differential signal lines land on glass fiber fabrics at random, thereby resulting in the pin skew.

Existing methods for controlling differential signal skew mainly include: rotating glass fiber fabrics during processes, tilting all wires as a whole (to make the wires and the glass fiber warps and wefts form acute angles), or a zig-zag routing approach.

At present, the commonly used approaches of rotating glass fiber fabrics, tilting all wires as a whole and zig-zag routing have defects in costs control and wiring space, and these defects impose more influences on backplanes of large size. Existing methods for controlling the differential line skew have at least the following problems.

1. In the approach of rotating glass fiber fabrics during process, the glass fiber fabrics need to be tailed, thereby resulting in wastes of materials and increase of costs. Particularly, if the approach is applied on large backplanes, more wastes of board materials and further increase of costs will occur.

2. in the zig-zag routing approach (or the zig-zag wiring approach), wires need to be adjusted by small angles for a number of times, thereby resulting in irregular layout, occupation of relatively large wiring space, increased difficulties in wiring and long design cycle. The zig-zag routing approach is suitable for sub-card (daughter card) wiring, and if the approach is applied on backplanes, more wiring space will be occupied.

3. in the approach of tilting all wires as a whole, wiring becomes more difficult, and more wiring time is needed.

This section provides background information related to the present disclosure which is not necessarily prior art.

SUMMARY

Embodiments of the present disclosure provide a method for wiring different signal lines and a PCB, which are capable of solving the technical problems in existing wiring method for controlling the differential signal skew, i.e., high costs, occupation of relatively large wiring space, and long wiring time.

Aiming at solving at least the above technical problems, embodiments of the present disclosure provide a method for wiring differential signal lines, including:

providing a rectangle-shaped glass fiber fabric formed of glass fibers which are woven and interlaced with each other and an adhesive filled between the glass fibers;

determining a wiring direction of differential signal lines, and obtaining a glass fiber bundle number of the glass fiber fabric in the wiring direction, wherein the wiring direction includes a length direction or a width direction of the glass fiber fabric;

equally dividing the glass fiber fabric into glass fiber units, the number of which is equal to the glass fiber bundle number, and obtaining a width of each glass fiber unit according to a size of the glass fiber fabric in a direction perpendicular to the wiring direction and the number of the glass fiber units, wherein each of the glass fiber unit includes glass fibers in the wiring direction and the adhesive;

determining a line distance between the differential signal lines and line widths of the differential signal lines according to the width of each glass fiber unit; and according to the line distance and the line widths, wiring on a metal layer along the wiring direction to form the required differential signal lines, wherein the metal layer is adhered to a surface of the glass fiber fabric.

The step of determining the line distance between the differential signal lines and the line widths of the differential signal lines according to the width of each glass fiber unit includes with the width of each glass fiber unit as a center distance between the differential signal lines, determining the line distance between the differential signal lines and the line widths of the differential signal lines according to the center distance between the differential signal lines.

The step of determining the line distance between the differential signal lines and the line widths of the differential signal lines according to the center distance between the differential signal lines includes:

based on a rule of using a wider differential line and a rule of tight coupling between the differential signal lines, determining the line distance between the differential signal lines and the line widths of the differential signal lines according to the center distance between the differential signal lines.

If widths of the glass fibers in at least two of the glass fiber units are not equal, the step of, according to the line distance between the differential signal lines and the line widths of the differential signal lines, wiring on the metal layer along the wiring direction to form the required differential signal lines comprises includes:

according to the line distance and the line widths, forming differential signal lines of a predetermined length at an original wiring position along the wiring direction;

according to the line distance and the line widths, performing wiring offsetting on the metal layer along the wiring direction with an acute angle and an offset width to form the required differential signal lines, wherein the offset width is determined according to the width of each glass fiber unit.

The step of, according to the line distance and the line widths, performing wiring offsetting on the metal layer along the wiring direction with the acute angle and the offset width to form the required differential signal lines includes:

determining the offset width for performing the offsetting according to the width of each glass fiber unit;

performing the offsetting with respect to differential signal lines formed last time with the acute angle and the offset width along the wiring direction, and after the offsetting is finished, forming the differential signal lines of the predetermined length along the wiring direction according to the line distance and the line widths; and continuously repeating the above two steps until the required differential signal lines are formed.

The step of determining the offset width for performing the offsetting according to the width of each glass fiber unit includes:

calculating the offset width for performing the offsetting by the following formula:

$X2=(a+½)*X$, $a=0, ±1, ±2, ±3, ±4 \ldots ±n$, wherein n is a positive integer greater than 4, X2 is the offset width, and X is the width of each glass fiber unit; and wherein the value of a is different for each calculation the offset width.

The predetermined length is between 1800 mils and 2200 mils.

Aiming at solving at least the above technical problems, embodiments of the present disclosure further provide a printed circuit board (PCB), including:

a rectangle-shaped glass fiber fabric; and a metal layer adhered to a surface of the glass fiber fabric via an adhesive;

wherein the glass fiber fabric is formed of glass fibers which are woven and interlaced with each other and the adhesive filled between the glass fibers;

wherein a differential signal line pair is formed on the metal layer, and extends along a size direction of the glass fiber fabric;

wherein, in the size direction of the glass fiber fabric, the glass fiber fabric includes glass fiber units, the number of which is equal to a glass fiber bundle number, and each of the glass fiber unit includes glass fibers in the size direction of the glass fiber fabric and the adhesive;

wherein a line distance between differential signal lines in the differential signal line pair and line widths of the differential signal lines are determined according to a width of each glass fiber unit;

wherein the size direction of the glass fiber fabric includes a length direction or a width length of the glass fiber fabric.

A center distance between the differential signal lines in the differential signal line pair is equal to the width of each glass fiber unit.

Differential signal lines formed by wiring offsetting are disposed on the metal layer;

an offset width between two adjacent wirings of the differential signal line pair is determined according to the width of the glass fiber unit; and an offset angle between the two adjacent wirings of the differential signal line pair is an acute angle.

Embodiments of the present disclosure have the following advantageous effects:

The method for wiring differential signal lines and the PCB provided by embodiments of the present disclosure can effectively eliminate or suppress the skew of differential signals resulted from the glass fiber weave effect, improve quality of signals, and save costs, wiring space and time. The method for wiring differential signal lines provided by embodiments of the present disclosure includes: providing a rectangle-shaped glass fiber fabric formed of glass fibers which are woven and interlaced with each other and an adhesive filled between the glass fibers; determining a wiring direction of differential signal lines, and obtaining a glass fiber bundle number of the glass fiber fabric in the wiring direction, wherein the wiring direction includes a length direction or a width direction of the glass fiber fabric; equally dividing the glass fiber fabric into glass fiber units, the number of which is equal to the glass fiber bundle number, and obtaining a width of each glass fiber unit according to a size of the glass fiber fabric in a direction perpendicular to the wiring direction and the number of the glass fiber units, wherein each of the glass fiber unit includes glass fibers in the wiring direction and the adhesive; determining a line distance between the differential signal lines and line widths of the differential signal lines according to the width of each glass fiber unit; and according to the line distance and the line widths, wiring on a metal layer along the wiring direction to form required differential signal lines, wherein the metal layer is adhered to a surface of the glass fiber fabric. The wiring method provided by embodiments of the present disclosure can make the differential signal lines P/N land at positions of the same Dk dielectric property, thereby effectively eliminating or suppressing the skew of differential signals resulted from the glass fiber weave effect and improving the quality of the differential signals. Also, the wiring method provided by embodiments of the present disclosure can save costs and avoid wastes of plate materials. Further, in the wiring method provided by embodiments of the present disclosure, wires are formed along a warp direction or a weft direction (i.e., a length direction or a width direction of the glass fiber fabric), the wiring space can be saved. Finally, the wiring method is simple and easy to implement, and can save wiring time and shorten the development cycle.

The wiring method provided by embodiments of the present disclosure can realize routing of high-speed differential signals on backplanes, can be applied on backplanes of large size, and have strong practicality.

This section provides a summary of various implementations or examples of the technology described in the disclosure, and is not a comprehensive disclosure of the full scope or all features of the disclosed technology.

DETAILED DESCRIPTION

The present disclosure will be described in detail in the following embodiments with reference to the drawings.

First Embodiment

Figure 1:
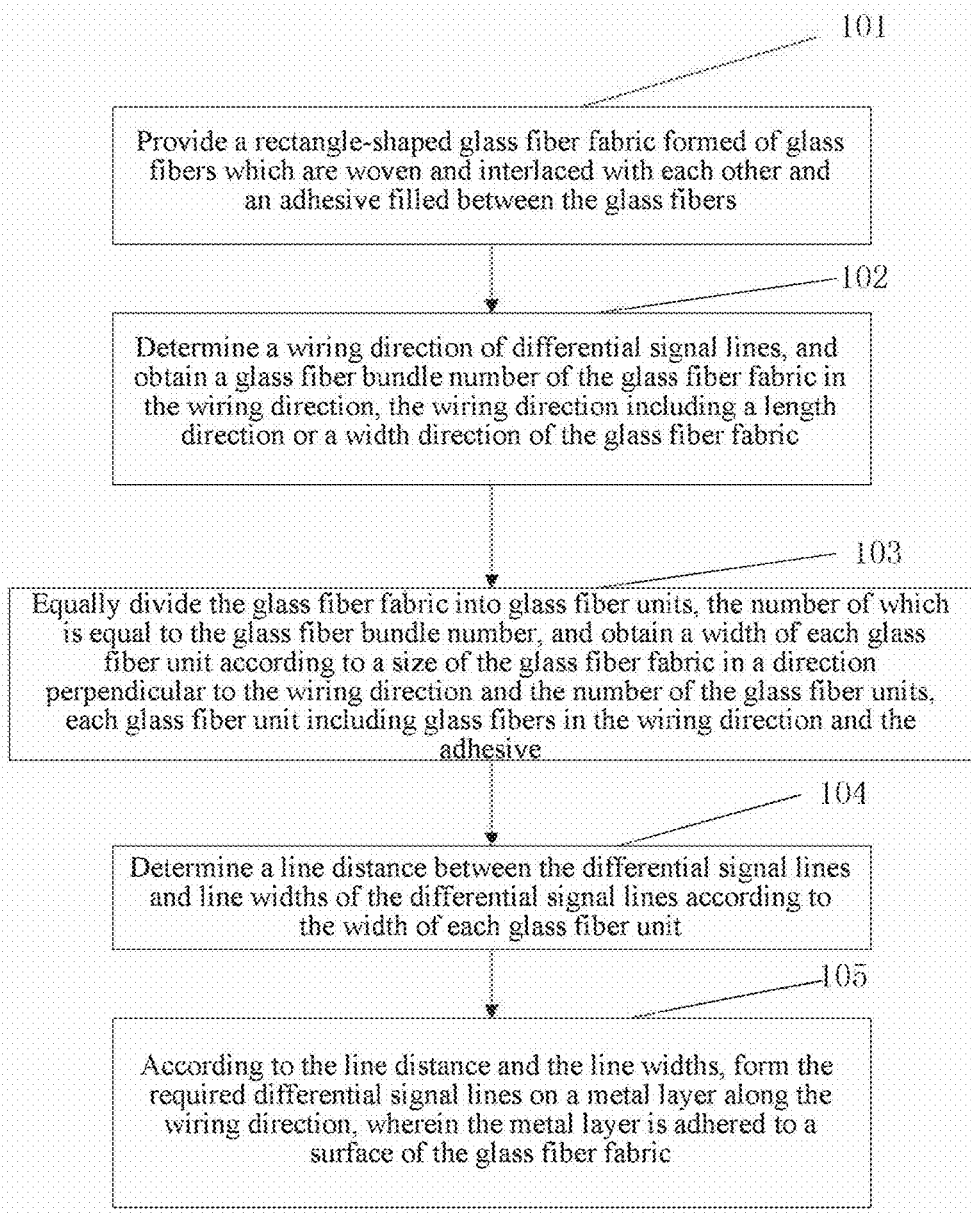
FIG. 1 is a flow chart of a method for wiring differential signal lines according to a first embodiment of the present disclosure.

Considering the technical problems in existing wiring method for controlling the differential signal skew, i.e., high costs, occupation of relatively large wiring space, and long wiring time, the embodiment of the present disclosure provides a method for wiring differential signal lines. As shown in FIG. 1, the method includes the following steps.

In step 101, a rectangle-shaped glass fiber fabric is provided. The glass fiber fabric is formed of glass fibers which are woven and interlaced with each other and an adhesive filled between the glass fibers.

In the embodiment, the rectangle-shaped glass fiber fabric includes glass fibers which are woven and interlaced with each other, the glass fibers running in the length direction of the rectangle-shaped glass fiber fabric are called as wafts, and the glass fibers running in the width direction of the rectangle-shaped glass fiber fabric are called as warps.

In step 102, a wiring direction of differential signal lines is determined, and a glass fiber bundle number of the glass fiber fabric in the wiring direction is obtained. The wiring direction includes the length direction or the width direction of the glass fiber fabric.

In the embodiment, the wiring direction may be selected from either one of the warp direction and the waft direction.

In the step, the obtaining of the number of glass fibers of the glass fiber fabric in the wiring direction refers to obtaining of the number of warp bundles or weft bundles. For example, if the wiring is performed along the warp direction, it is needed to obtain the number of the warp bundles of the glass fiber fabric. Specifically, the number can be obtained in the following ways.

First, specifications of the glass fiber fabric used in the stackup design are determined, and the warp and waft bundle numbers of the glass fiber fabric having the specifications are obtained as m×n by using the IPC standard. Assuming that the wiring is performed on a glass fiber fabric of a length of one inch, the warp and waft bundle numbers per inch of the glass fiber fabric having such specifications can be obtained according to the IPC standard. The IPC standard stipulates the warp and weft bundle numbers per inch.

In step 103, the glass fiber fabric is equally divided into glass fiber units, the number of which is equal to the glass fiber bundle number, and a width of each glass fiber unit is obtained according to a size of the glass fiber fabric in a direction perpendicular to the wiring direction and the number of the glass fiber units. Each of the glass fiber units includes glass fibers in the wiring direction and the adhesive.

After the number of the warps or the wefts (i.e., the bundle number) is obtained, the glass fiber fabric may be divided into a plurality of glass fiber units having the same width, i.e., the glass fiber fabric is equally divided into a plurality of glass fiber units. If the wiring is performed along the warp direction, the number of the glass fiber units is equal to the number of the warps, and each of the glass fiber unit includes warps (i.e., glass fibers running the width direction) and the adhesive (i.e., the adhesive disposed in the width direction, for example, epoxy resin). If the wiring is performed along the weft direction, the number of the glass fiber units is equal to the number of the wefts, and each of the glass fiber unit includes wefts and the adhesive. In the embodiment, the adhesive can be filled across the whole of the glass fiber unit, including the adhesive adhered to the glass fibers, and the adhesive filled between adjacent glass fibers, and the width of the adhesive in the glass fiber unit is equal to the width of the glass fiber unit.

The obtaining of the width of each glass fiber unit in this step can be realized in the following ways.

If the wiring is performed along the warp direction, the width of each glass fiber unit can be obtained by dividing the length of the glass fiber fabric by the number of the warps. For example, if the length of the glass fiber fabric is one inch and the number of the warps is n, the width X of each glass fiber unit is 1000/n (mils).

If the wiring is performed along the weft direction, the width of each glass fiber unit can be obtained by dividing the width of the glass fiber fabric by the number of the wefts. For example, if the width of the glass fiber fabric is one inch and the number of the wefts is m, the width X of each glass fiber unit is 1000/m (mil).

In step 104, a line distance between the differential signal lines and line widths of the differential signal lines are determined according to the width of each glass fiber unit.

This step can include:

with the width of each glass fiber unit as a center distance between the differential signal lines, determining the line distance between the differential signal lines and the line widths of the differential signal lines according to the center distance between the differential signal lines.

If the wiring is performed along the warp direction, the center distance between the differential lines is designed as $X1=X=1000/n$ (mils); if the wiring is performed along the weft direction, the center distance between the differential lines is designed as $X1=X=1000/n$ (mil). Then, the distance between the differential lines and the widths of the differential lines (i.e., the line distance and the line widths) are determined according to X1.

According to an exemplary embodiment, based on a rule of using a wider differential line and a rule of tight coupling between the differential signal lines, the distance the line distance) between the differential signal lines and the widths (i.e., the line widths) of the differential signal lines are determined according to the center distance.

Specifically, on the premise that the manufacture process can be guaranteed, following the rule of using a wider differential line and the rule of tight coupling between the differential signal lines, the distance between the differential signal lines and the widths of the differential signal lines can be determined according to differential impedance and the center distance.

In step 105, according to the line distance and the line widths, wiring is performed on a metal layer along the wiring direction to form required differential signal lines. The metal layer is adhered to a surface of the glass fiber fabric.

After the distance between the differential signal lines and the widths of the differential signal lines are obtained, wiring can be perforated on the metal layer along the warp or weft direction to form the required pair of differential signal lines. The length of the pair of differential signal lines can be determined according to actual wiring requirements.

The wiring method provided by the embodiment can make the differential signal lines P/N land at positions of the same Dk dielectric property, thereby effectively eliminating or suppressing the skew of differential signals resulted from the glass fiber weave effect and improving the quality of the differential signals. Also, the wiring method provided by the embodiment of the present disclosure can save costs and avoid wastes of plate materials. Further, in the wiring method provided by embodiments of the present disclosure, wires are formed along a warp direction or a weft direction (i.e., a length direction or a width direction of the glass fiber fabric), the wiring space can be saved. Finally, the wiring method is simple and easy to implement, and can save wiring time and shorten the development cycle.

In addition, the wiring method provided by the embodiment of the present disclosure can realize routing of high-speed differential signals on backplanes, can be applied on backplanes of large size, and have strong practicality.

Also, the wiring method provided by the present embodiment follows the rule of using a wider differential line and the rule of tight coupling between the differential signal lines to design the line distance between the differential signal lines and the line widths of the differential signal lines, thereby further reducing the p/n skew of the differential signals.

The wiring method of embodiments of the present disclosure will be described below with an example of a rectangle-shaped glass fiber fabric having certain specifications. In the example, the wiring is performed along the warp direction. The length of the rectangle-shaped glass fiber fabric having such specifications is one inch, and the warp and weft bundle numbers of the glass fiber fabric having such specifications are 60×60.

Figure 2:
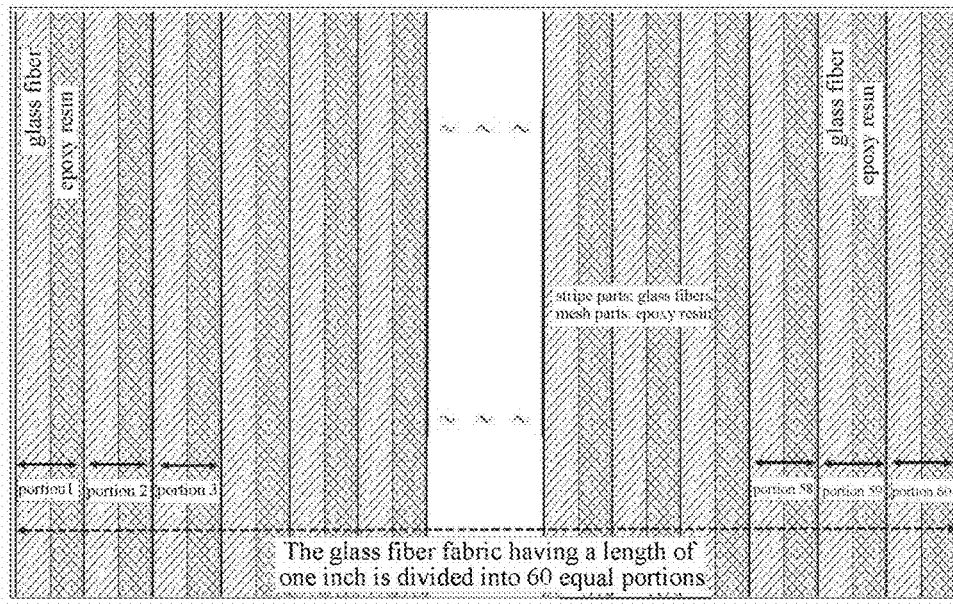
FIG. 2 is a schematic diagram illustratively showing the distribution of glass fibers and epoxy resins in a glass fiber fabric provided in the first embodiment.

First, the glass fiber fabric having the length of 1000 mils is divided into 60 equal portions, each portion (i.e., each glass fiber unit) includes two parts: the warps (glass fibers) and epoxy resins (let us assume that the two parts are distributed at equal intervals), as shown in FIG. 2.

Figure 3:
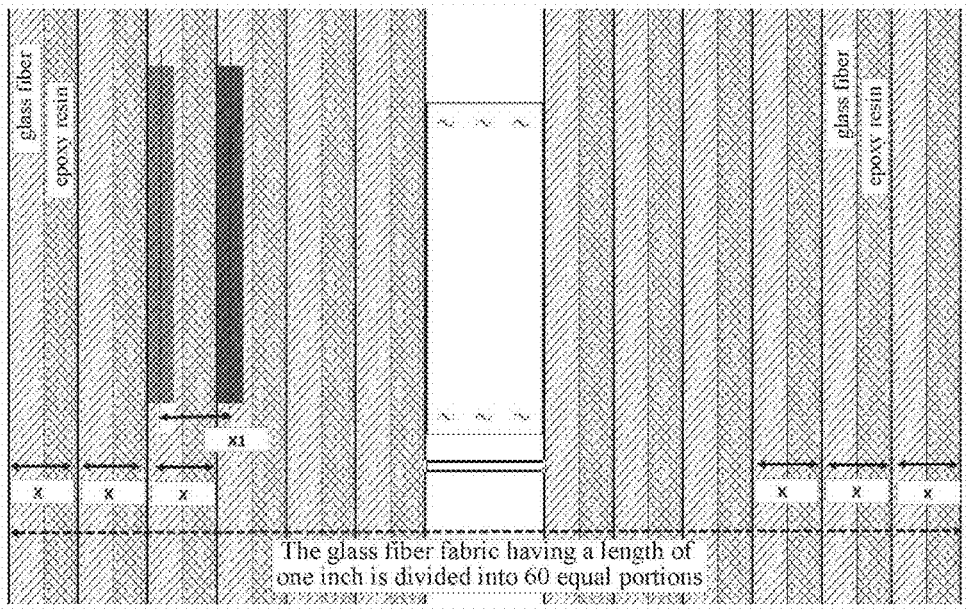
FIG. 3 is a schematic diagram illustratively showing a design of line widths of the differential signal lines and a line distance between the differential signal lines according to the first embodiment of the present disclosure.

By dividing 1000 mils into 60 equal portions, the size X of each portion is X=1000/60 mils=16.7 mils. Then, the center distance between the differential signal lines are designed. The design rule is that the center distance between the differential signal lines is equal to the spacing between the glass fiber portions, i.e., X1=X=16.7 mils, as shown in FIG. 3.

After the design of the center distance between the differential signal lines is finished in accordance with the above rule, assuming that the differential impedance is 100 ohm, with consideration of stackup situations and usage of wider lines and tight coupling design, the line width/line distance can be designed as 7.6/9/1/7.6 (mils), and the design of the line distance/line width of the differential signal lines is finished.

Figure 4:
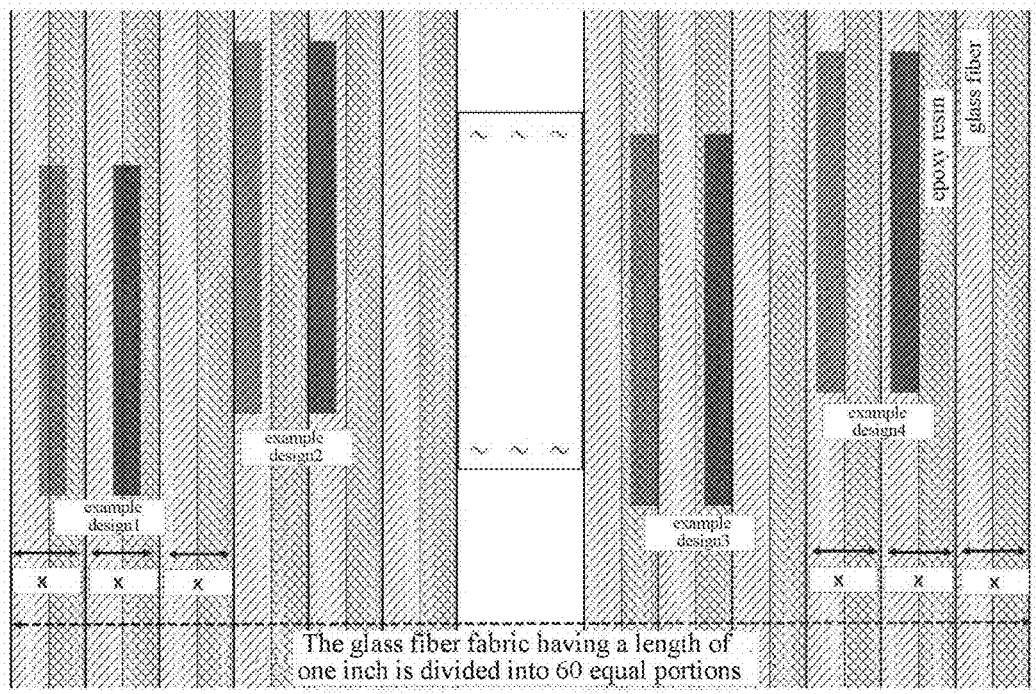
FIG. 4 is a schematic diagram illustratively showing the distribution of the differential signal lines on the glass fiber fabric according to the first embodiment of the present disclosure.

The differential lines obtained according to the above procedure can verify that no matter where the lines are disposed, the P/N signal lines of the differential signals can be located at the positions of the same Dk dielectric property, as shown in FIG. 4.

Figure 5:
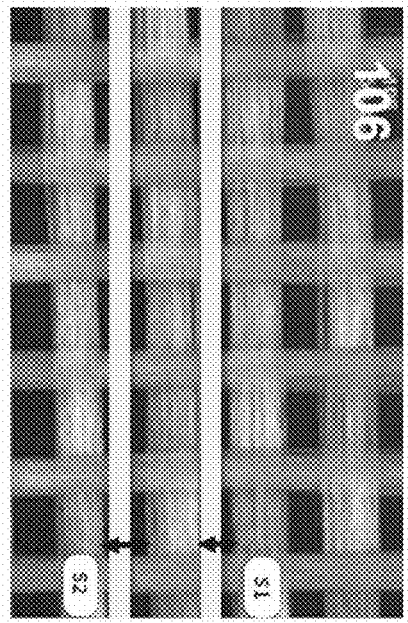
FIG. 5 is an enlarged diagram illustratively showing the actual spacing between warps and wefts according to the first embodiment of the present disclosure.

In practical manufacture process of glass fiber fabrics, the situation that the flat widths of a glass fiber fabric are not the same, i.e., the widths of the glass fibers are not the same. Thus, the spacing between two adjacent glass fibers may be different, as shown in FIG. 5. Because the widths of the warps are not the same, the warp spacing S1 is not equal to the warp spacing S2. Such situation may occur in both the warp and weft directions, and may occur at random during the manufacture process. Such situation may result in great increase of the differential signal skew and deterioration of signal quality.

In order to address the above issue, i.e., if widths of the glass fibers in at least two of the glass fiber units are not equal, the step 105 in the embodiment may include:

according to the line distance and the line widths, forming differential signal lines of a predetermined length at an original wiring position along the wiring direction;

according to the line distance and the line widths, performing wiring offsetting on the metal layer along the wiring direction with an acute angle and an offset width to form the required differential signal lines, wherein the offset width is determined according to the width of each glass fiber unit.

For example, after the line distance and the line widths are determined, differential signal lines of a predetermined length Y may be formed at an original point along the warp direction, and then offsetting is performed for the first time along the warp direction with an acute angle β and an offset width X2; after the first offsetting, differential signal lines of a predetermined length Y may be further formed on the metal layer; next, offsetting is performed for the second time along the warp direction with an acute angle β and an offset width X2, and differential signal lines of a predetermined length Y are further formed on the metal layer, and so on, until the required differential signal lines are formed.

According to an exemplary embodiment, the step of, according to the line distance and the line widths, performing wiring offsetting along the wiring direction with the acute angle and the offset width to form the required differential signal lines includes:

determining the offset width for performing the offsetting according to the width of each glass fiber unit;

performing the offsetting with respect to differential signal lines formed last time with the acute angle and the offset width along the wiring direction, and after the offsetting is finished, forming the differential signal lines of the predetermined length along the wiring direction according to the line distance and the line widths; and continuously repeating the above two steps until the required differential signal lines are formed.

In the embodiment, the offset width for every offsetting is determined according to the width of each glass fiber unit, and the value of the offset width varies every time when offsetting is performed. Specifically, the step of determining the offset width for performing the offsetting according to the width of each glass fiber unit includes:

calculating the offset width for performing the offsetting by the following formula:

$X2=(a+\frac{1}{2})*X$, $a=0, \pm 1, \pm 2, \pm 3, \pm 4 \ldots \pm n$, wherein n is a positive integer greater than 4, X2 is the offset width, and X is the width of each glass fiber unit; and wherein the value of a is different for each calculation the offset width.

According to an exemplary embodiment, the length of the lines formed every time have a length of 1800 mils to 2200 mils, i.e., the predetermined length is between 1800 mils and 2200 mils.

Further referring to the above example of a rectangle-shaped glass fiber fabric having certain specifications (assuming that wiring is performed along the warp direction), specific descriptions are made below.

After the line distance between the differential signal lines and line widths of the differential signal lines are determined, in practical manufacture process of glass fiber fabrics, the situation that the flat widths of a 60-bundle glass fiber fabric are not the same the widths of warps are not the same) may occur, as shown in FIG. 5. In order to solve this problem, one way is to offset lines along the warp direction with an acute angle β and a width X2, wherein X2=(a+½)*X, a=0, ±1, ±2, ±3, ±4 . . . ±n. In each offsetting, the basis is the first offsetting, and the values of a cannot be the same.

According to the IPC standard, the glass fiber fabric has 60 bundles of warps, and it can calculated that X=1000/60 mils=16.7 mils. The offset width for performing wiring offsetting in the warp direction may be X2=(a+½)*16.7 mils.

Every time when the offsetting is finished, wiring is performed along the current direction according to the line distance/line widths (7.6/9.1/7.6 mils) determined as described above to form differential signal lines of a length Y; then, next offsetting is performed until the required differential signal lines are formed. The length Y is controlled to be 2000 mils±200 mils.

When the above wiring offsetting is performed, the following rules need to be followed:

(1) when offsetting at an offset width X2 is finished, the angel β is an acute angle;

(2) when offsetting is performed for a plurality of times at an offset width X2, the value of a is determined on the basis of the first value of a the value of a in the offsetting for the first time), and the values of a cannot be the same in the calculation formula of X2;

(3) after each offsetting, the wiring is performed along the direction as originally designed, and the length of lines formed during each offsetting needs to be controlled to be 2000 mils±200 mils.

The offsetting can be performed for one or more times depending on the distance between two devices on a PCB for which differential signal lines need to be arranged and the length Y in each wiring offsetting.

The skew between the differential signal lines after the differential signal lines are formed according to the above wiring offsetting method will be described.

Figure 6:
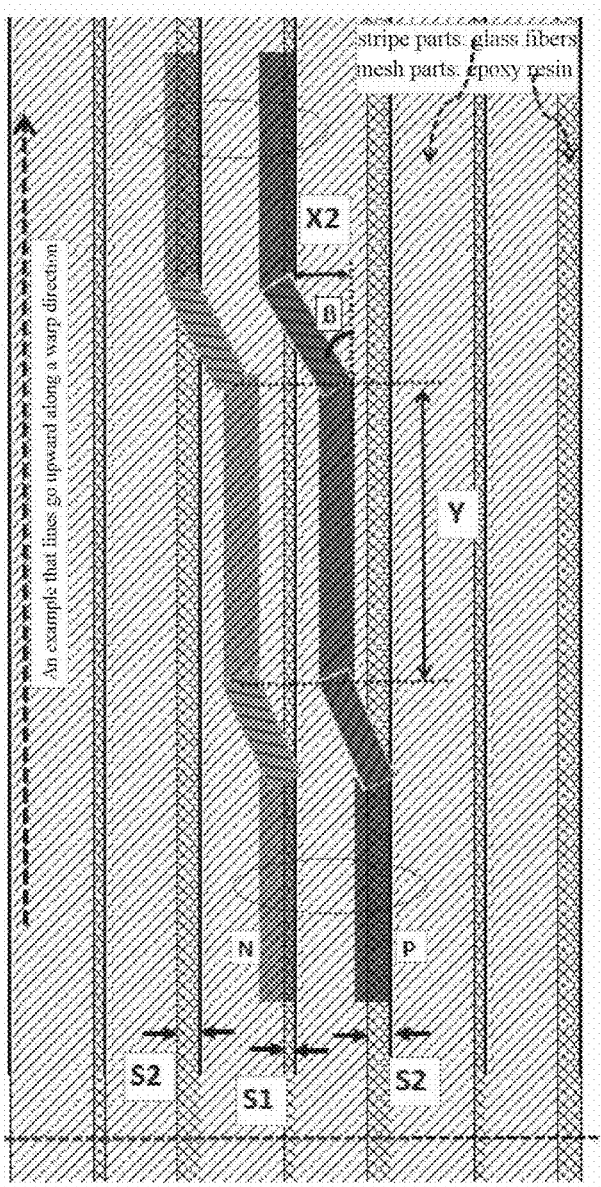
FIG. 6 is a schematic diagram illustratively showing a first PCB wiring offset according to the first embodiment of the present disclosure.
Figure 7:
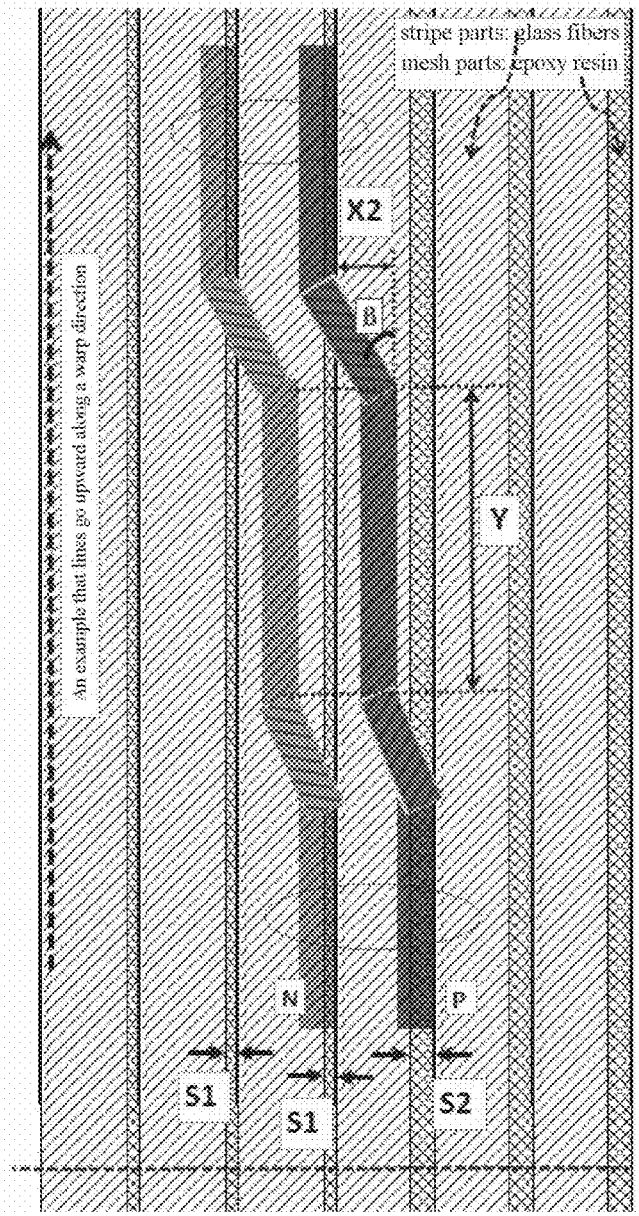
FIG. 7 is a schematic diagram illustratively showing a second PCB wiring offset according to the first embodiment of the present disclosure.
Figure 8:
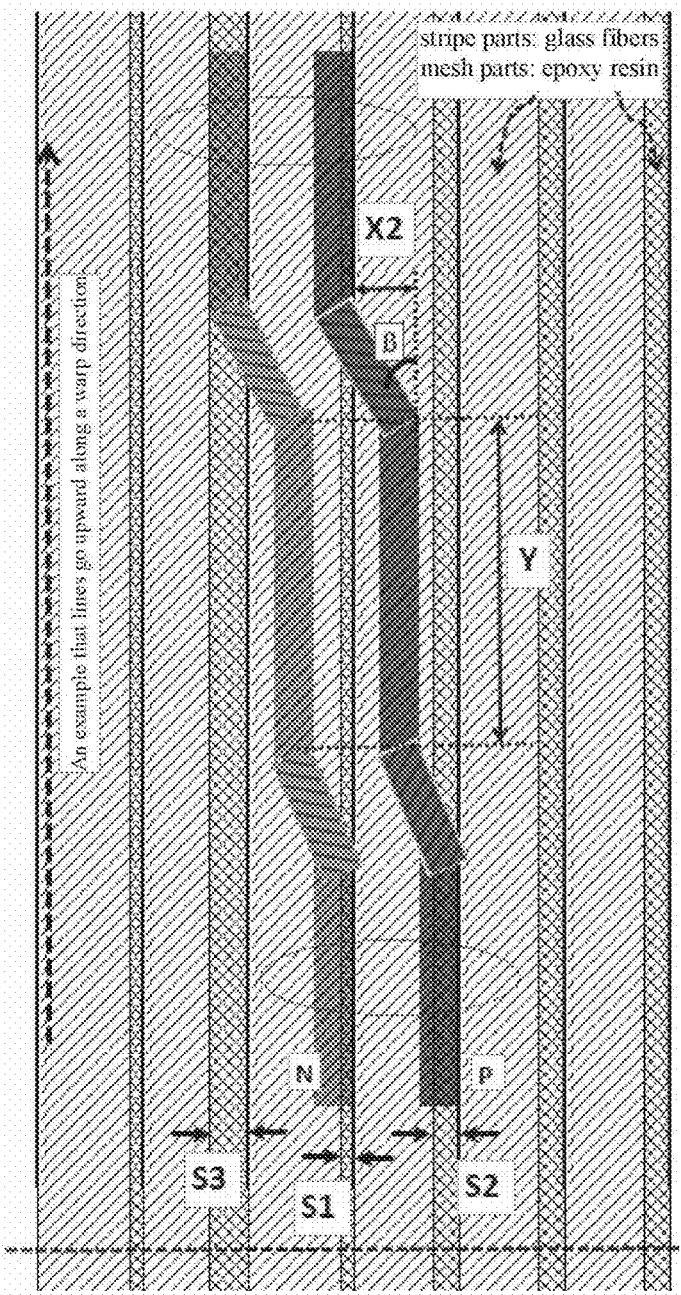
FIG. 8 is a schematic diagram illustratively showing a third PCB wiring offset according to the first embodiment of the present disclosure.

If the original lines of a PCB land on two areas where the warp spacings are different, as shown in FIGS. 6 to 8, the lowermost lines (i.e., the formed differential signal lines of the length Y) fall on the warp spacing S1 and the warp spacing S2, respectively. After the offsetting is performed for the first time with the acute angle β and the offset width X2, differential signal lines of the length Y are further formed. As shown in FIGS. 6 to 8, the lines after the first offsetting land on the warp width. Then, offsetting is performed for the second time with the acute angle β and the offset width X2, until the required differential signal line pair is formed.

As shown in FIG. 6, after the second offsetting, the lines land on the warp spacing S2 and the warp spacing S1, i.e., on the warp spacings opposite to the original wiring positions (S1, S2). At this time, the skew of the differential signal lines formed after the second wiring offsetting and the skew of the differential signal lines originally formed cancel out each other, and the differential signal lines formed after the second offsetting constitute the whole skew compensation of the differential signal lines as originally formed. By observing the whole differential signal pair, the P/N signal lines almost become the compensation of the whole skew.

As shown in FIG. 7, after the second offsetting, the lines land on the warp spacing S1 and the warp spacing S2, i.e., on the warp spacings same as the original wiring positions (S1, S2). At this time, the skew of the differential signal lines formed after the second wiring offsetting and the skew of the differential signal lines as originally formed are the same. By observing the whole differential signal pair, skew is compensated for ⅔ length.

As shown in FIG. 8, after the second offsetting, the lines land on the warp spacing S3 and the warp spacing S1, i.e., on the warp spacings totally different from the original wiring positions (S1, S2). At this time, the differential signal line pair formed after the second wiring offsetting compensate for the skew of the differential signal lines as originally formed. By observing the whole differential signal pair, skew is compensated for more than ⅓ length.

The method provided by the embodiment s verified by applying the method in the layout design of the backplane of a product. After practical test, the actual differential line p/n skew is controlled very sell, as shown in Table 1 which shows test data of the backplane of the product. In the table, the values of SKEW represent the test values of different line layers of different lengths ranging from several inches to tens of inches.

TABLE 1

| Test channel | SKEW (ps) | Test channel | SKEW (ps) | Test channel | SKEW (ps) | Test channel | SKEW (ps) |
|---|---|---|---|---|---|---|---|
| Channel 1 | 5.6 | Channel 5 | 0.8 | Channel 9 | 8.0 | Channel 13 | 5.2 |
| Channel 2 | 2.8 | Channel 6 | 2.4 | Channel 10 | 4.8 | Channel 14 | 3.6 |
| Channel 3 | 1.6 | Channel 7 | 0.8 | Channel 11 | 11.2 | Channel 15 | 12.4 |
| Channel 4 | 8.4 | Channel 8 | 4.8 | Channel 12 | 2.4 | Channel 16 | 6.4 |

Second Embodiment

In the embodiment, the wiring method along the warp direction wild be described. The wiring method includes the following steps.

In step S01, suitable glass fiber fabric specifications are selected first according to requirements of high-speed signaling and stackup design, and then bundle numbers are obtained by referring to the IPC standard, for example, the warp and weft bundle numbers of the glass fiber fabric having such specifications are m×n; then, the value X of each equal portion can be obtained, for example, X=1000/m mils in the warp direction, as shown in FIG. 2.

In step S02, according to the backplane layout, a wiring direction meeting requirements is selected. If the wiring is performed along the warp direction, the center distance between the differential signal lines may be designed as X1=X=1000/m mils, as shown in FIG. 3.

In step S03, according to the center distance X1 between the differential signal lines, on the premise that the differential impedance is determined, the design of the line distance between the differential signal lines and the line widths of the differential lines is completed by following the rule of using a wider differential line and a rule of tight coupling between the differential signal lines, as shown in FIG. 4.

In step S04, when forming lines on the PCB, lines of a length of about 2000 mils are formed along the warp direction of the glass fiber fabric from the original point according to the line distance and the line widths determined in the step S03.

In step S05, after step S04 is completed, offsetting is performed for the first time along the warp direction with an acute angle and an offset width of (a+½)*X, wherein a=0, ±1, ±2, ±3, ±4 . . . ±n.

In step S06, after the first offsetting is finished, lines are further formed along the warp direction with a length of about 2000 mils, and then offsetting is performed for the second time with an acute angle and an offset width X2. When X2 in the second offsetting is calculated, the value of a is different from the value of a in the first offsetting.

In step S07, after step S06 is completed, lines of a length of about 2000 mils are further formed along the warp direction, and then the offsetting is performed for the third time; then, lines of a length of about 2000 rails are further formed, and so on, until the required differential signal lines are formed, as shown in FIG. 6, or 7, or 8.

It should be noted that when X2 is calculated for performing the offsetting steps, the value of a when X2 is calculated in the first offsetting should be used as a basis, and when next X2 is calculated, the value of a cannot be the same as the previous values of a.

Figure 9:
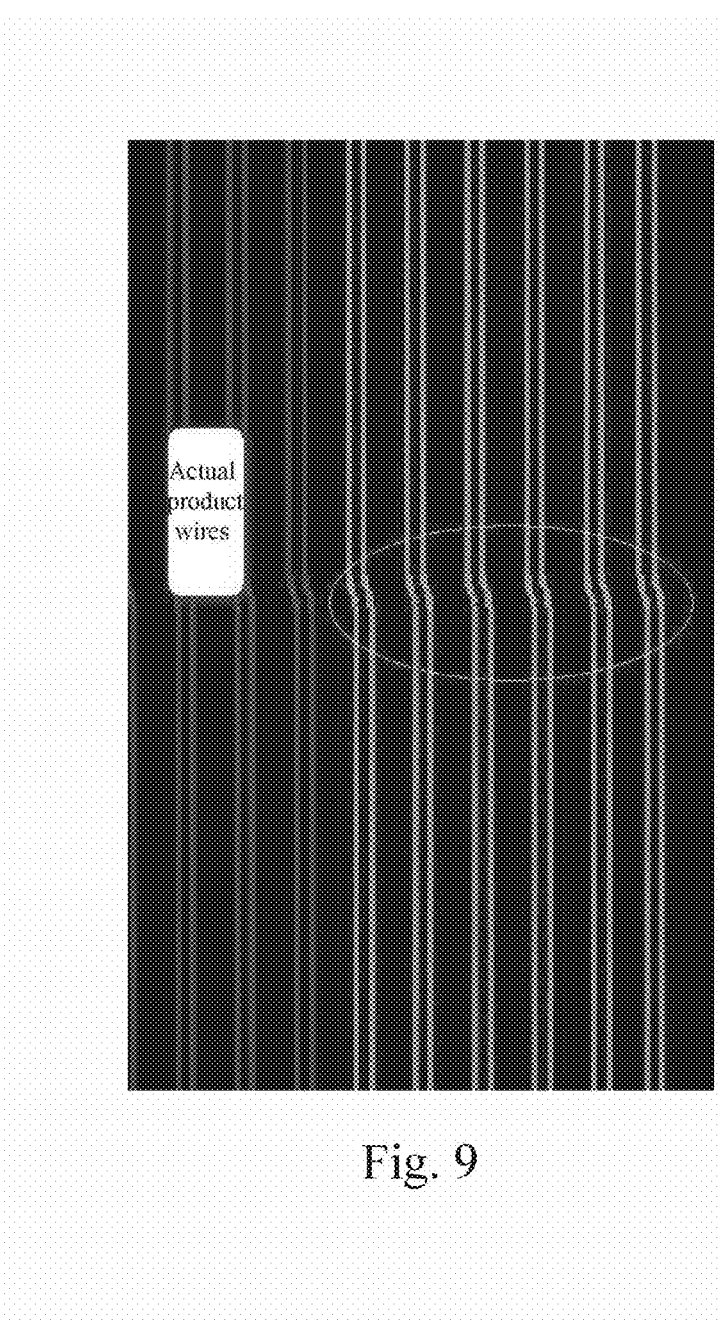
FIG. 9 is schematic diagram showing an actual PCB layout design according to a second embodiment of the present disclosure.

In practical wiring process, the required differential signal lines formed using the above steps may be shown in FIG. 9, in which a plurality of differential signal line pairs formed using the above steps are included.

In the first and second embodiments, while wiring is performed along the warp direction, wiring can be performed along the weft direction, and the procedure is similar to the above described methods. For details, the above description regarding the wiring method along the warp direction can be referred to, and repeated descriptions are omitted here.

Third Embodiment

The embodiment provides a PCB, including: a rectangle-shaped glass fiber fabric; and a metal layer adhered to a surface of the glass fiber fabric via an adhesive; wherein the glass fiber fabric is formed of glass fibers which are woven and interlaced with each other and the adhesive filled between the glass fibers; wherein a differential signal line pair is formed on the metal layer, and extends along a size direction of the glass fiber fabric; wherein, in the size direction of the glass fiber fabric, the glass fiber fabric comprises glass fiber units, the number of which is equal to a glass fiber bundle number, and each of the glass fiber unit comprises glass fibers in the size direction of the glass fiber fabric and the adhesive;

wherein a line distance between differential signal lines in the differential signal line pair and line widths of the differential signal lines are determined according to a width of each glass fiber unit;

wherein the size direction of the glass fiber fabric comprises a length direction or a width length of the glass fiber fabric.

According to an exemplary embodiment, a center distance between the differential signal lines in the differential signal line pair is equal to the width of each glass fiber unit.

According to an exemplary embodiment, differential signal lines formed by wiring offsetting are disposed on the metal layer;

wherein an offset width between two adjacent wirings of the differential signal line pair is determined according to the width of the glass fiber unit; and wherein an offset angle between the two adjacent wirings of the differential signal lines is an acute angle. Detailed structures can be found in FIGS. 6 to 8.

The present disclosure is described in detail with reference to specific implementations. However, the present disclosure is not limited to these specific implementations. It is obvious to those skilled in this art that many deductions or substitutions without departing from the concept of the present disclosure can be made, and such deductions or substitutions are encompassed in the protection scope of the present disclosure.

INDUSTRIAL APPLICABILITY

In view of the above, embodiments of the present disclosure provide a method for wiring differential signal lines and a PCB, which have the following advantageous effects. The method for wiring differential signal lines and the PCB provided by embodiments of the present disclosure can effectively eliminate or suppress the skew of differential signals resulted from the glass fiber weave effect, improve quality of signals, and save costs, wiring space and time. The method for wiring differential signal lines provided by embodiments of the present disclosure includes: providing a rectangle-shaped glass fiber fabric formed of glass fibers which are woven and interlaced with each other and an adhesive filled between the glass fibers; determining a wiring direction of differential signal lines, and obtaining a glass fiber bundle number of the glass fiber fabric in the wiring direction, wherein the wiring direction includes a length direction or a width direction of the glass fiber fabric; equally dividing the glass fiber fabric into glass fiber units, the number of which is equal to the glass fiber bundle number, and obtaining a width of each glass fiber unit according to a size of the glass fiber fabric in a direction perpendicular to the wiring direction and the number of the glass fiber units, wherein each of the glass fiber unit includes glass fibers in the wiring direction and the adhesive; determining a line distance between the differential signal lines and line widths of the differential signal lines according to the width of each glass fiber unit; and according to the line distance and the line widths, wiring on a metal layer along the wiring direction to form required differential signal lines, wherein the metal layer is adhered to a surface of the glass fiber fabric. The wiring method provided by embodiments of the present disclosure can make the differential signal lines P/N land at positions of the same Dk dielectric property, thereby effectively eliminating or suppressing the skew of differential signals resulted from the glass fiber weave effect and improving the quality of the differential signals. Also, the wiring method provided by embodiments of the present disclosure can save costs and avoid wastes of plate materials. Further, in the wiring method provided by embodiments of the present disclosure, wires are formed along a warp direction or a weft direction (i.e., a length direction or a width direction of the glass fiber fabric), the wiring space can be saved. Finally; the wiring method is simple and easy to implement, and can save wiring time and shorten the development cycle.

The invention claimed is:

1. A printed circuit board (PCB), comprising:
a rectangle-shaped glass fiber fabric; and
a metal layer adhered to a surface of the glass fiber fabric via an adhesive;
wherein the glass fiber fabric is formed of glass fibers which are woven and interlaced with each other, with the adhesive filled between the glass fibers;
wherein a differential signal line pair is formed on the metal layer, and extends along a size direction of the glass fiber fabric;
wherein, in the size direction of the glass fiber fabric, the glass fiber fabric comprises glass fiber units, the number of which is equal to a glass fiber bundle number, and each of the glass fiber unit comprises glass fibers in the size direction of the glass fiber fabric and the adhesive;

wherein a line distance between differential signal lines in the differential signal line pair and line widths of the differential signal lines are determined according to a width of each glass fiber unit;

wherein the size direction of the glass fiber fabric comprises a length direction or a width length of the glass fiber fabric;

wherein differential signal lines formed by wiring offsetting are disposed on the metal layer;

wherein an offset width between two adjacent wirings of the differential signal line pair is determined according to the width of the glass fiber unit;

wherein the offset width meets the following formula: $X2=(a+\frac{1}{2})*X$, $a=0, \pm1, \pm2, \pm3, \pm4 \ldots n$, wherein n is a positive integer greater than 4, X2 is the offset width, and X is the width of each glass fiber unit; and wherein the value of a is different for each calculation the offset width.

2. The PCB according to claim 1, wherein a center distance between the differential signal lines in the differential signal line pair is equal to the width of each glass fiber unit.

3. The PCB according to claim 1,
wherein an offset angle between the two adjacent wirings of the differential signal line pair is an acute angle.

4. The PCB according to claim 2,
wherein an offset angle between the two adjacent wirings of the differential signal line pair is an acute angle.

* * * * *